(12) United States Patent
Karpov et al.

(10) Patent No.: US 8,841,644 B2
(45) Date of Patent: Sep. 23, 2014

(54) THERMAL ISOLATION IN MEMORY CELLS

(75) Inventors: Elijah V. Karpov, Portland, OR (US); David L. Kencke, Beaverton, OR (US)

(73) Assignee: Micron Technology, Inc., Boise, ID (US)

(*) Notice: Subject to any disclaimer, the term of this patent is extended or adjusted under 35 U.S.C. 154(b) by 102 days.

(21) Appl. No.: 13/542,830

(22) Filed: Jul. 6, 2012

(65) Prior Publication Data
US 2014/0008602 A1    Jan. 9, 2014

(51) Int. Cl.
*H01L 47/00* (2006.01)
(52) U.S. Cl.
USPC .............. 257/4; 257/E45.001; 257/E21.004; 257/E21.645
(58) Field of Classification Search
CPC . H01L 27/1214; H01L 27/12; H01L 29/7869; H01L 29/66742; H01L 29/42384; H01L 27/11551; H01L 27/228; H01L 29/792
USPC ................ 257/4, E45.001, E21.004, E21.645
See application file for complete search history.

(56) References Cited

U.S. PATENT DOCUMENTS

| 7,838,864 | B2 | 11/2010 | Parkinson |
| 7,906,369 | B2 | 3/2011 | Lowrey |
| 2008/0142777 | A1* | 6/2008 | Park et al. .................. 257/4 |
| 2009/0310402 | A1 | 12/2009 | Parkinson |
| 2010/0163817 | A1 | 7/2010 | Savransky et al. |

* cited by examiner

*Primary Examiner* — Michelle Mandala
(74) *Attorney, Agent, or Firm* — Brooks, Cameron & Huebsch, PLLC

(57) ABSTRACT

Thermal isolation in memory cells is described herein. A number of embodiments include a storage element, a selector device formed in series with the storage element, and an electrode between the storage element and the selector device, wherein the electrode comprises an electrode material having a thermal conductivity of less than 0.15 Watts per Kelvin-centimeter (W/K-cm).

27 Claims, 3 Drawing Sheets

US 8,841,644 B2

THERMAL ISOLATION IN MEMORY CELLS

TECHNICAL FIELD

The present disclosure relates generally to semiconductor memory devices, methods, and systems, and more particularly, to thermal isolation in memory cells.

BACKGROUND

Memory devices are typically provided as internal, semiconductor, integrated circuits and/or external removable devices in computers or other electronic devices. There are many different types of memory, including random-access memory (RAM), read only memory (ROM), dynamic random access memory (DRAM), synchronous dynamic random access memory (SDRAM), flash memory, and resistance variable memory, among others. Types of resistance variable memory include programmable conductor memory, resistive random access memory (RRAM), phase change random access memory (PCRAM), magnetoresistive random access memory (MRAM; also referred to as magnetic random access memory), and conductive-bridging random access memory (CBRAM), among others.

Memory devices such as resistance variable memory devices may be utilized as non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players such as MP3 players, movie players, and other electronic devices. Data, such as program code, user data, and/or system data, such as a basic input/output system (BIOS), are typically stored in non-volatile memory devices.

Resistance variable memory such as PCRAM includes memory cells that can store data based on the resistance state of a storage element, e.g., a memory element having a variable resistance. The storage element of a PCRAM cell may comprise a phase change memory material, such as a chalcogenide material, e.g., Germanium-Antimony-Telluride (GST).

As such, resistance variable memory cells, such as PCRAM cells, can be programmed to store data corresponding to a target data state by varying the resistance level of the storage element. One of a number of data states, e.g., resistance states, can be set for a resistance variable memory cell. For example, a single level cell (SLC) may be programmed to one of two data states, e.g., logic 1 or 0, which can depend on whether the cell is programmed to a resistance above or below a particular level. As an additional example, various resistance variable memory cells can be programmed to one of multiple different resistance states corresponding to multiple data states. Such cells may be referred to as multi state cells, multi-digit cells, and/or multilevel cells (MLCs), and can represent multiple binary digits of data, e.g., 10, 01, 00, 11, 111, 101, 100, 1010, 1111, 0101, 0001, etc.

Resistance variable memory cells can comprise a selector device, e.g., a switch, coupled in series with the storage element in a cross-point array structure, for instance. As an example, the storage element can comprise a resistance variable material, e.g., a phase change memory (PCM) material, formed between a pair of electrodes. The storage element can be formed in series with the selector device, which can be a two terminal selector device comprising a selector device material formed between a pair of electrodes. In various instances, an electrode, e.g., a middle electrode, can be shared by the storage element and the selector device. The other two electrodes, between which the selector device material and storage element material are formed, can be coupled to respective conductive lines of the array, e.g., a word line and a bit line. In instances in which a storage element comprising a PCM material is formed in series with a selector device, the array of cells can be referred to as a PCMS (phase change memory/switch) array.

DETAILED DESCRIPTION

Figure 1:
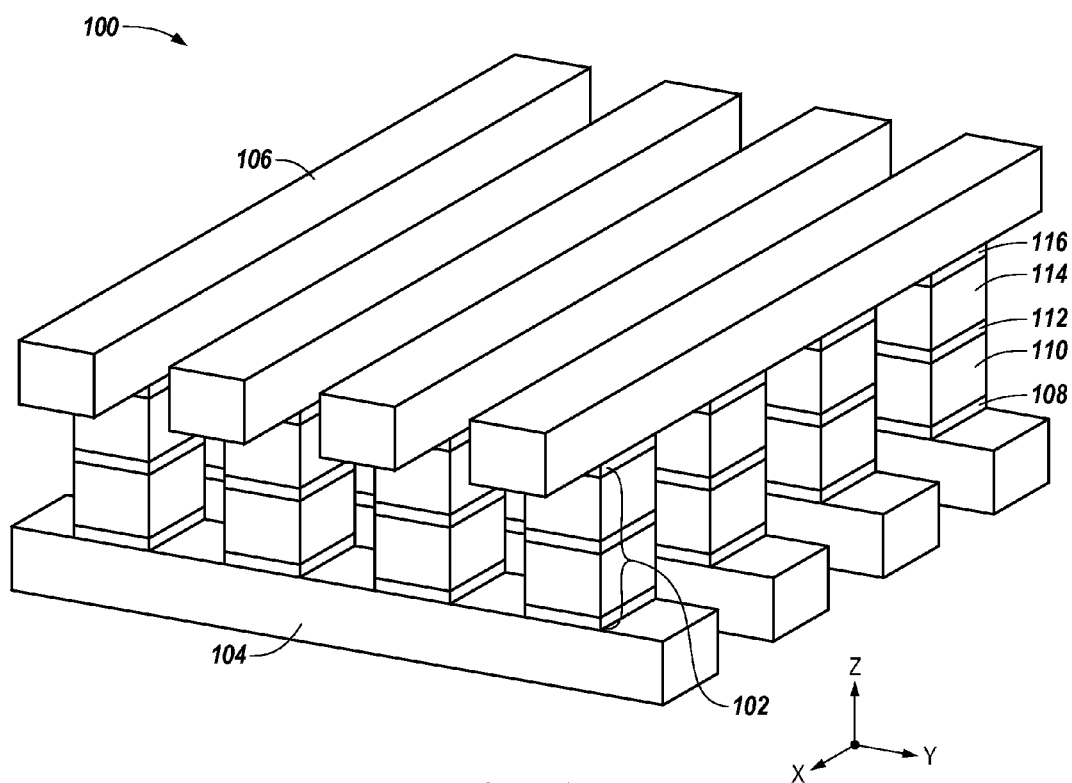
FIG. 1 is a schematic of a portion of a memory array in accordance with a number of embodiments of the present disclosure.

Thermal isolation in memory cells is described herein. A number of embodiments include a storage element, a selector device formed in series with the storage element, and an electrode between the storage element and the selector device, wherein the electrode comprises an electrode material having a thermal conductivity of less than 0.15 Watts per Kelvin-centimeter (W/K-cm).

Memory cells, e.g., PCMS cells, in accordance with a number of embodiments of the present disclosure may include middle electrodes having a low thermal conductivity as compared to previous memory cells. As used herein, a low thermal conductivity refers to a thermal conductivity of less than 0.15 W/K-cm. As a result of their low thermal conductivity as compared to previous memory cells, memory cells in accordance with a number of embodiments of the present disclosure can provide improved thermal isolation between the selector device and the storage element of the cell. Providing cells having improved thermal isolation can reduce the temperature increase experienced by a selector device due to the increased temperature of the storage element during operation, e.g., programming, for instance. As such, the improved thermal isolation can increase the reliability and/or decrease the variability of the cells as compared with previous resistance variable memory cells, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

FIG. 1 is a schematic of a portion of a memory array 100 in accordance with a number of embodiments of the present disclosure. In the example shown in FIG. 1, array 100 is a phase change memory/switch (PCMS) array. However, embodiments of the present disclosure are not so limited.

Array 100 can be a cross-point array having memory cells 102 located at the intersections of a number of conductive lines, e.g., access lines 104, which may be referred to herein as word lines, and a number of conductive lines, e.g., data/sense lines 106, which may be referred to herein as bit lines. As illustrated in FIG. 1, word lines 104 are parallel to each other and are orthogonal to bit lines 106, which are parallel or substantially parallel to each other. However, embodiments are not so limited. Word lines 104 and/or bit lines 106 can be a metal material such as tungsten, copper, titanium, aluminum, and/or other conductive materials, for example. In a number of embodiments, array 100 can be a portion, e.g., a level, of a three-dimensional array, e.g., a multi-level array, (not shown in FIG. 1) in which other arrays similar to array 100 are at different levels, for example above and/or below array 100.

Each memory cell 102 can include a storage element coupled in series with a respective selector device, e.g., access device. The storage element can be, for example, a resistive storage element. The resistive storage element may comprise a memory material 110 formed between a pair of electrodes, e.g., 108 and 112. Memory material 110 can be a resistance variable material such as a phase change memory (PCM) material, for example.

The selector device can be a two terminal device such as a diode or switch, such as an ovonic threshold switch (OTS), e.g., an OTS thin film selector, or an ovonic memory switch (OMS). However, embodiments of the present disclosure are not limited to a particular type of selector device. For example, the selector device can be a field effect transistor (FET), a bipolar junction transistor (BJT), or a diode, among other types of selector devices. The selector device can comprise a selector device material 114 formed between a pair of electrodes, e.g., 112 and 116. The selector device can be fabricated before or after the storage element is fabricated.

Electrodes 108 and 116 can comprise materials such as Ti, Ta, W, Al, Cr, Zr, Nb, Mo, Hf, B, C, conductive nitrides of the aforementioned materials, e.g., TiN, TaN, WN, CN, etc.), and/or combinations thereof. Electrode 112 can comprise materials having a low thermal conductivity, e.g., less than 0.15 W/K-cm, as will be further described herein.

The resistive storage elements of cells 102 can comprise a resistance variable material 110, e.g., a PCM material. As an example, the PCM material can be a chalcogenide alloy such as a Germanium-Antimony-Tellurium (GST) material, e.g., Ge—Sb—Te materials such as $Ge_2Sb_2Te_5$, $Ge_1Sb_2Te_4$, $Ge_1Sb_4Te_7$, $Ge_8Sb_5Te_8$, $Ge_4Sb_4Te_7$, etc., or an indium(In)-antimony(Sb)-tellurium(Te) (IST) material, e.g., $In_2Sb_2Te_5$, $In_1Sb_2Te_4$, etc., among other phase change memory materials. The hyphenated chemical composition notation, as used herein, indicates the elements included in a particular mixture or compound, and is intended to represent all stoichiometries involving the indicated elements. Other phase change memory materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. However, embodiments of the present disclosure are not limited to a particular type of PCM material. Further, embodiments are not limited to storage elements comprising PCM materials. For instance, the storage elements can comprise a number of resistance variable materials such as binary metal oxides, colossal magnetoresistive materials, and/or various polymer-based resistive variable materials, among others.

In a number of embodiments, the selector devices corresponding to cells 102 can be OTS's comprising a chalcogenide selector device material 114 formed between electrodes 112 and 116. In such embodiments, the chalcogenide material 114 of the selector device may not actively change phase, e.g., between amorphous and crystalline, such as a chalcogenide resistance variable material 110 of the resistive storage element. However, the chalcogenide material 114 of the selector device can change between an "on" and "off" state depending on the voltage potential applied across cells 102. The state of the OTS can change when a current through the OTS exceeds a threshold current or a voltage across the OTS exceeds a threshold voltage. Once the threshold current or voltage is reached, the on state is triggered and the OTS can be in a conductive state. If the current or voltage potential drops below a threshold value, the OTS can return to a non-conductive state.

In a number of embodiments, resistance variable material 110 can comprise one or more of the same material(s) as selector device material 114. However, embodiments are not so limited. For example, resistance variable material 110 and selector device material 114 can comprise different materials.

Memory cells 102 can be programmed to a target data state, e.g., corresponding to a particular resistance state, by applying sources of an electrical field or energy, such as positive or negative electrical pulses, to the cells, e.g., to the storage element of the cells, for a particular duration. The electrical pulses can be, for example, positive or negative voltage or current pulses.

Figure 2:
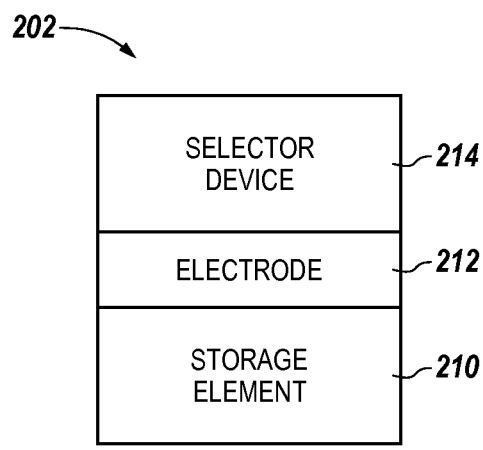
FIG. 2 illustrates a portion of a memory cell in accordance with a number of embodiments of the present disclosure.

FIG. 2 illustrates a portion of a memory cell 202 in accordance with a number of embodiments of the present disclosure. Memory cell 202 can be analogous to memory cells 102 previously described in connection with FIG. 1. For instance, memory cell 202 can be a resistance variable memory cell such as a PCMS cell.

As shown in FIG. 2, memory cell 202 includes a storage element 210, a selector device 214 formed in series with storage element 210, and an electrode 212 between and adjacent storage element 210 and selector device 214. That is, electrode 212 can be a shared electrode formed between storage element 210 and selector device 214. Electrode 212 can electrically connect storage element 210 and selector device 214, and can have a low thermal conductivity, as will be further described herein.

Storage element 210 can be, for example, a resistive storage element comprising a resistance variable material, e.g., a PCM material, in a manner analogous to the storage element previously described in connection with FIG. 1. Selector device 214 can be, for example, a two terminal device such as a diode or switch, e.g., an OTS, comprising a selector device material in a manner analogous to the selector device previously described in connection with FIG. 1.

Electrode 212 can have a low thermal conductivity, e.g., a thermal conductivity of less than 0.15 Watts per Kelvin-centimeter (W/K-cm). Further, electrode 212 can have a resistivity, e.g., an electrical resistivity, of greater than 0.1 milliohm-centimeter (mΩ-cm). Materials having such a thermal conductivity and resistivity, e.g., materials that can be used for electrode 212, include, for example, chalcogenide alloys such as crystalline GST materials, tantalum (Ta), tantalum nitride (TaN), titanium silicon nitride (TiSiN), titanium aluminum nitride (TiAlN), and carbon (C), among other types of materials, as will be further described herein, e.g., in connection with FIG. 4. That is, electrode 212 can comprise chalcogenide, Ta, TaN, TiSiN, TiAlN, and/or C, for instance.

As a result of its low thermal conductivity, electrode 212 can thermally isolate storage element 210 from selector device 214 during operation, e.g., programming, of memory cell 202. For instance, electrode 212 can reduce the temperature increase experienced by selector device 214 due to the increased temperature of storage element 210 during programming. The thermal isolation of storage element 210 from selector device 214 can increase the reliability and/or decrease the variability of memory cell 202 as compared with previous resistance variable memory cells, among other benefits.

The thermal conductivity (κ) of electrode 212 can be given by the Wiedemann-Franz law:

$$\kappa = LT/\rho + K_{phonon}$$

where L is the Lorenz number ($2.44 \times 10^{-8}$ W$\Omega$K$^{-2}$), T is the temperature of electrode 212 (in Kelvins), ρ is the resistivity of electrode 212 (in Ω-cm), and $K_{phonon}$ is the phonon contribution to the thermal conductivity of electrode 212 (in W/K-cm). In a number of embodiments of the present disclosure, the thermal conductivity of electrode 212 may not include phonon contributions, e.g., $K_{phonon}$ can be zero. That is, the thermal conductivity of electrode 212 may include only electronic contributions, e.g., the thermal conductivity of electrode 212 may be only electronic. Accordingly, the ratio of the thermal conductivity of electrode 212 to the resistivity of electrode 212, e.g., the Lorenz ratio of electrode 212, can be low, such that even at the low thermal conductivity of electrode 212, the electrical resistivity of electrode 212 can still be low enough for sufficient current to pass through electrode 212 and be applied to storage element 210 during programming. That is, the resistivity of electrode 212 can remain sufficiently low such that memory cell 202, e.g., storage element 210, is adequately programmed, despite the reduced thermal conductivity of electrode 212, as compared to previous memory cells.

In embodiments in which electrode 212 comprises chalcogenide, electrode 212 may have a melting temperature that is greater than the temperature of electrode 212 during programming of memory cell 202, which can prevent electrode 212 from changing phase during programming of memory cell 202. Further, in embodiments in which electrode 212 and storage element 210 both comprise chalcogenide, the chalcogenide material of electrode 212 can be a different type of chalcogenide material than the chalcogenide material of storage element 210.

Memory cell 202 can include additional elements and/or components not illustrated in FIG. 2 for simplicity and so as not to obscure embodiments of the present disclosure. For example, memory cell 202 can include additional electrodes, such as a bottom electrode and a top electrode analogous to electrodes 108 and 116, respectively, previously described in connection with FIG. 1. The bottom electrode can be below storage element 210, e.g., storage element 210 can be formed between and adjacent the bottom electrode and electrode 212, and the top electrode can be above selector device 214, e.g., selector device 214 can be formed between and adjacent electrode 212 and the top electrode. That is, storage element 210 can be formed on the bottom electrode, and the top electrode can be formed on selector device 214. However, embodiments of the present disclosure are not so limited. For instance, in a number of embodiments, selector device 214 can be formed on the bottom electrode and the top electrode can be formed on storage element 210, e.g., the physical positions of storage element 210 and selector device 214 can be reversed.

Figure 3:
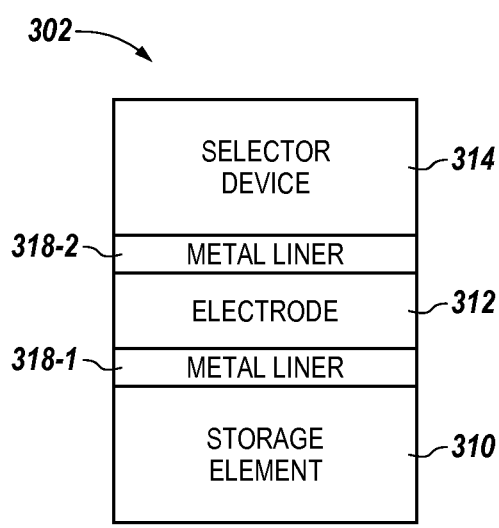
FIG. 3 illustrates a portion of a memory cell in accordance with a number of embodiments of the present disclosure.

FIG. 3 illustrates a portion of a memory cell 302 in accordance with a number of embodiments of the present disclosure. Memory cell 302 can be analogous to memory cells 102 previously described in connection with FIG. 1. For instance, memory cell 302 can be a resistance variable memory cell such as a PCMS cell.

As shown in FIG. 3, memory cell 302 includes a storage element 310, a selector device 314 formed in series with storage element 310, an electrode 312 between storage element 310 and selector device 314, a first barrier material, e.g., liner, 318-1 between and adjacent storage element 310 and electrode 312, and a second barrier material, e.g., liner, 318-2 between and adjacent electrode 312 and selector device 314. Storage element 310, electrode 312, and selector device 314 can be analogous to storage element 210, electrode 212, and selector device 214, respectively, previously described in connection with FIG. 2. For example, electrode 312 can have a low thermal conductivity, storage element 310 can be a resistive storage element comprising a resistance variable material, e.g., a PCM material, and selector device 314 can be a two terminal device such as a diode or switch, e.g., an OTS, comprising a selector device material, in a manner analogous to that previously described in connection with FIG. 2.

Barrier materials 318-1 and 318-2 can be, for example, metal materials. Barrier material 318-1 can provide a diffusion barrier between storage element 310 and electrode 312, and barrier material 318-2 can provide a diffusion barrier between electrode 312 and selector device 314. Although two barrier materials 318-1 and 318-2 are shown in the embodiment illustrated in FIG. 3, embodiments of the present disclosure are not limited to a particular number of barrier materials. For example, more or fewer than two barrier materials can be included between storage element 310 and electrode 312, and/or between electrode 312 and selector device 314. Further, although barrier materials 318-1 and 318-2 are shown as being separate from electrode 312 in the embodiment illustrated in FIG. 3, in a number of embodiments barrier materials 318-1 and/or 318-2 can be considered to be a part of electrode 312.

Memory cell 302 can include additional elements and/or components not illustrated in FIG. 3 for simplicity and so as not to obscure embodiments of the present disclosure. For example, memory cell 302 can include additional electrodes, such as a bottom electrode and a top electrode, in a manner analogous to that previously described in connection with FIG. 2. Further, in a number of embodiments, the physical positions of storage element 310 and selector device 314 can be reversed, in a manner analogous to that previously described in connection with FIG. 2.

Figure 4:
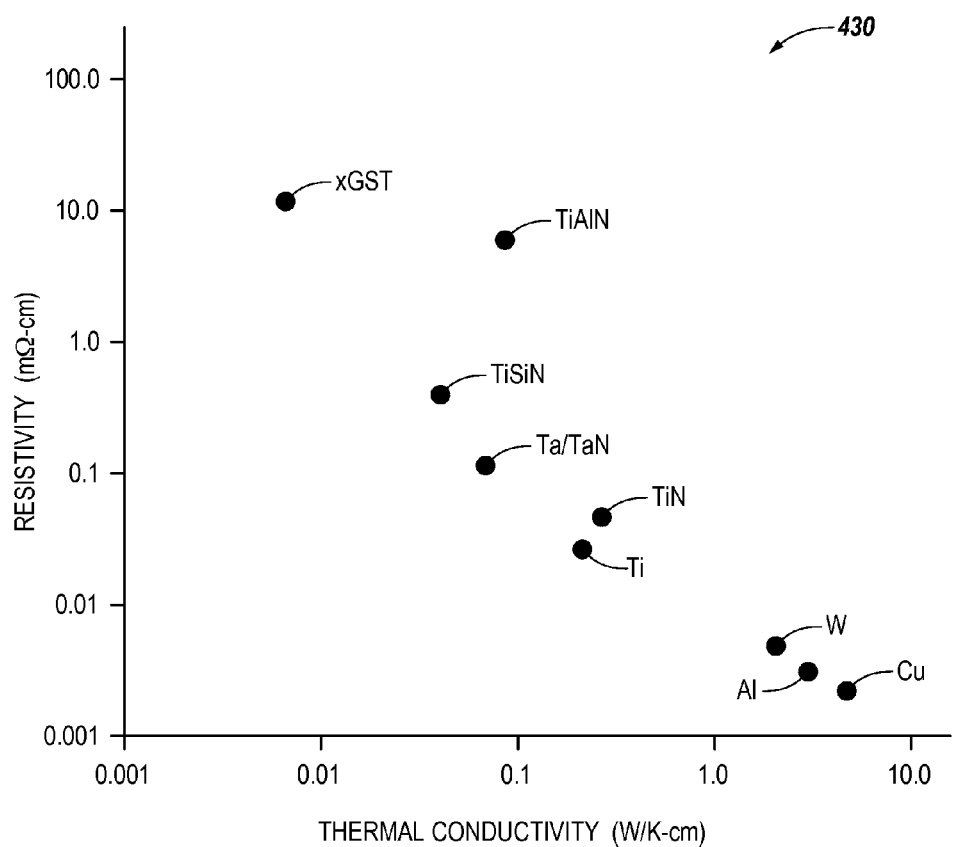
FIG. 4 is a graph illustrating the thermal conductivities and resistivities of a number of electrode materials in accordance with previous approaches and a number of electrode materials in accordance with a number of the present disclosure.

FIG. 4 is a graph 430 illustrating the thermal conductivities and resistivities, e.g., electrical resistivities, of a number of electrode materials. For example, graph 430 illustrates the thermal conductivities and resistivities of a number of materials that can be used for electrodes, such as middle electrodes 112, 212, and 312 previously described in connection with FIGS. 1-3. Graph 430 also illustrates the thermal conductivities and resistivities of a number of materials that may be used for electrodes, e.g., middle electrodes, in memory cells in accordance with previous approaches.

As previously described herein, electrode materials that can be used in memory cells in accordance with a number of embodiments of the present disclosure can include, for example, chalcogenide alloys such as crystalline GST (xGST) materials, tantalum (Ta), tantalum nitride (TaN), titanium silicon nitride (TiSiN), and titanium aluminum nitride (TiAlN), among other materials. As shown in FIG. 4, each of these electrode materials has a low thermal conductivity, e.g., a thermal conductivity of less than 0.15 W/K-cm. For instance, xGST has a thermal conductivity of approximately 0.01 W/K-cm. Accordingly, each of these electrode materials can provide thermal isolation during memory cell operation, e.g., programming, as previously described herein. Further, as shown in FIG. 4, each of these electrode materials has a resistivity of greater than 0.1 mΩ-cm. However, the resistivity of each of these electrode materials is low enough to provide sufficient programming current, as previously described herein.

In contrast, electrode materials used in memory cells in accordance with previous approaches can include, for example, titanium (Ti), titanium nitride (TiN), tungsten (W), aluminum (Al), and copper (Cu), among other materials. As shown in FIG. 4, each of these electrode materials has a high thermal conductivity, e.g., a thermal conductivity of greater than 0.15 W/K-cm. Accordingly, each of these electrode materials may not be able to provide adequate thermal isolation during memory cell operation, e.g., programming. Further, as shown in FIG. 4, each of these electrode materials has a resistivity of less than 0.1 mΩ-cm.

CONCLUSION

Thermal isolation in memory cells is described herein. A number of embodiments include a storage element, a selector device formed in series with the storage element, and an electrode between the storage element and the selector device, wherein the electrode comprises an electrode material having a thermal conductivity of less than 0.15 Watts per Kelvin-centimeter (W/K-cm).

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
   a storage element;
   a selector device formed in series with the storage element; and
   a chalcogenide electrode between the storage element and the selector device, wherein the chalcogenide electrode comprises a chalcogenide electrode material having a thermal conductivity of less than 0.15 Watts per Kelvin-centimeter (W/K-cm).

2. The memory cell of claim 1, wherein the chalcogenide electrode material has a resistivity of greater than 0.1 milliohm-centimeter (mΩ-cm).

3. The memory cell of claim 1, wherein the memory cell includes at least one of:
   a first barrier material between the storage element and the chalcogenide electrode; and
   a second barrier material between the chalcogenide electrode and the selector device.

4. The memory cell of claim 3, wherein the first and second barrier materials are metal materials.

5. The memory cell of claim 1, wherein the chalcogenide electrode thermally isolates the selector device from the storage element during operation of the memory cell.

6. The memory cell of claim 1, wherein the storage element includes a phase change memory material.

7. The memory cell of claim 1, wherein the selector device is an ovonic threshold switch.

8. The memory cell of claim 1, wherein:
   the storage element is between the chalcogenide electrode and a first additional electrode; and
   the selector device is between the chalcogenide electrode and a second additional electrode.

9. The memory cell of claim 1, wherein the memory cell is coupled to an access line and a data/sense line in a cross-point array of memory cells.

10. The memory cell of claim 1, wherein the memory cell is coupled to an access line and a data/sense line in a three-dimensional array of memory cells.

11. A method of processing a memory cell, comprising:
    forming an electrode between a resistive storage material and a selector device material, wherein:
       the electrode comprises an electrode material having a thermal conductivity of less than 0.15 Watts per Kelvin-centimeter (W/K-cm);
       the electrode material has a resistivity of greater than 0.1 milliohm-centimeter (mΩ-cm); and
       at least one of the resistive storage material and the electrode material comprises a chalcogenide material.

12. The method of claim 11, wherein forming the electrode includes forming the electrode between a first diffusion barrier and a second diffusion barrier.

13. The method of claim 11, wherein the method includes:
   forming the resistive storage material between the electrode and a first additional electrode; and
   forming the selector device material between the electrode and a second additional electrode.

14. A memory cell, comprising:
   a resistive storage material formed between a first electrode and a second electrode; and
   a selector device material formed between the second electrode and a third electrode, wherein:
      the second electrode comprises an electrode material having a thermal conductivity of less than 0.15 Watts per Kelvin-centimeter (W/K-cm);
      the second electrode material has an electrical resistivity of greater than 0.1 milliohm-centimeter (mΩ-cm); and
      the second electrode material comprises a chalcogenide.

15. The memory cell of claim 14, wherein the selector device material comprises a switch.

16. The memory cell of claim 15, wherein the switch is an ovonic threshold switch.

17. The memory cell of claim 14, wherein:
   the first electrode is coupled to at least one of a bit line and a word line corresponding to the memory cell; and
   the third electrode is coupled to at least one of the bit line and the word line.

18. The memory cell of claim 14, wherein the memory cell is a resistance variable memory cell.

19. The memory cell of claim 18, wherein the resistance variable memory cell is a phase change memory/switch memory cell.

20. The memory cell of claim 14, wherein the thermal conductivity of the second electrode material is 0.1 W/K-cm to 0.01 W/K-cm.

21. The memory cell of claim 14, wherein the thermal conductivity of the second electrode material includes no phonon contributions.

22. A memory cell, comprising:
   a chalcogenide electrode formed between a resistive storage material and a selector device material;
   a first barrier material formed between the chalcogenide electrode and the resistive storage material; and
   a second barrier material formed between the chalcogenide electrode and the selector device material.

23. The memory cell of claim 22, wherein the chalcogenide electrode comprises a crystalline chalcogenide material.

24. The memory cell of claim 23, wherein the crystalline chalcogenide material is crystalline Germanium-Antimony-Tellurium (GST).

25. The memory cell of claim 22, wherein the chalcogenide electrode comprises a chalcogenide electrode material having a thermal conductivity of less than 0.15 Watts per Kelvin-centimeter (W/K-cm).

26. The memory cell of claim 22, wherein the chalcogenide electrode has a melting temperature greater than a temperature of the chalcogenide electrode during programming of the memory cell.

27. The memory cell of claim 22, wherein the chalcogenide electrode does not change phase during programming of the memory cell.

* * * * *